(12) United States Patent
Chen et al.

(10) Patent No.: US 10,674,820 B2
(45) Date of Patent: *Jun. 9, 2020

(54) SLIDE RAIL ASSEMBLY AND DRIVING MECHANISM THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shih-Lung Huang, Kaohsiung (TW); Yi-Syuan Jhao, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 216 days.

This patent is subject to a terminal disclaimer.

(21) Appl. No.: 15/923,102

(22) Filed: Mar. 16, 2018

(65) Prior Publication Data

US 2019/0090634 A1 Mar. 28, 2019

(30) Foreign Application Priority Data

Sep. 22, 2017 (TW) .............................. 106132863 A (51) Int. Cl.
*A47B 88/467* (2017.01)
*H05K 7/14* (2006.01)
(Continued)

(52) U.S. Cl.
CPC .......... *A47B 88/467* (2017.01); *A47B 88/477* (2017.01); *A47B 88/483* (2017.01);
(Continued)

(58) Field of Classification Search
CPC ... H05K 7/1489; F16C 2314/72; F16C 29/10; A47B 2088/4675; A47B 88/483; A47B 88/477; A47B 88/467
(Continued)

(56) References Cited

U.S. PATENT DOCUMENTS 3,331,624 A * 7/1967 Pugh ..................... E05B 85/243
292/216
3,350,128 A * 10/1967 Martens ................ E05B 85/243
292/341.12
(Continued)

FOREIGN PATENT DOCUMENTS

EP 3025615 A1 6/2016
JP H0621438 U 3/1994
JP 3196135 U 2/2015

*Primary Examiner* — Daniel J Troy
*Assistant Examiner* — Timothy M Ayres
(74) *Attorney, Agent, or Firm* — Alan D. Kamrath; Karin L. Williams; Mayer & Williams PC (57) ABSTRACT

A slide rail assembly includes a first rail, a second rail and a driving mechanism. The second rail is movable relative to the first rail. The second rail includes an engaging feature. The driving mechanism is arranged on the first rail. The driving mechanism includes a housing, a movable member, an actuating structure and an elastic member. The movable member is movable relative to the housing. The actuating structure is arranged on the movable member. The elastic member is configured to provide an elastic force to the movable member. Wherein, the actuating structure includes a first part and a second part. Wherein, the first part is configured to engage with the engaging feature of the second rail, and the second part is configured to prevent the engaging feature of the second rail from being disengaged from the first part.

18 Claims, 12 Drawing Sheets

(51) Int. Cl.
*A47B 88/477* (2017.01)
*A47B 88/483* (2017.01)
*F16C 29/10* (2006.01)

(52) U.S. Cl.
CPC ............ F16C 29/10 (2013.01); H05K 7/1489 (2013.01); *A47B 2088/4675* (2017.01); *F16C 2314/72* (2013.01)

(58) Field of Classification Search
USPC ........................................................ 312/333
See application file for complete search history.

(56) References Cited

U.S. PATENT DOCUMENTS

| | | | |
|---|---|---|---|
| 3,418,869 A * | 12/1968 | Herpich | F16H 53/06 74/569 |
| 3,572,797 A * | 3/1971 | Shay | E05B 85/045 292/341.12 |
| 3,591,225 A * | 7/1971 | Hagemeyer | E05B 85/045 292/340 |
| 4,285,560 A | 8/1981 | Miller | |
| 4,863,288 A * | 9/1989 | Houck | A47B 88/437 384/19 |
| 4,979,262 A * | 12/1990 | Lautenschlager | A47B 88/437 16/107 |
| 4,998,828 A | 3/1991 | Hobbs | |
| 7,878,606 B2 | 2/2011 | Chen et al. | |
| 8,147,010 B2 | 4/2012 | Chen et al. | |
| 8,256,853 B2 * | 9/2012 | Chen | F16C 29/02 312/319.1 |
| 8,376,425 B2 * | 2/2013 | Paskonis | E05B 85/045 292/341.12 |
| 8,671,520 B2 * | 3/2014 | Tanno | E05F 1/16 16/49 |
| 9,091,106 B2 * | 7/2015 | Allen | E05D 15/0652 |
| 9,364,089 B1 * | 6/2016 | Chen | A47B 88/467 |
| 9,759,002 B2 * | 9/2017 | Muller | E05F 3/10 |
| 2009/0115300 A1 * | 5/2009 | Chen | H05K 7/1421 312/334.1 |
| 2015/0366345 A1 | 12/2015 | Chen et al. | |
| 2016/0150880 A1 | 6/2016 | Chen et al. | |
| 2019/0330902 A1 * | 10/2019 | Chen | F16C 29/02 |

\* cited by examiner

SLIDE RAIL ASSEMBLY AND DRIVING MECHANISM THEREOF

BACKGROUND OF THE INVENTION

1. Field of the Invention

The present invention relates to a slide rail assembly, and more particularly, to a slide rail assembly having a driving mechanism with improved reliability.

2. Description of the Prior Art

Figure 1:
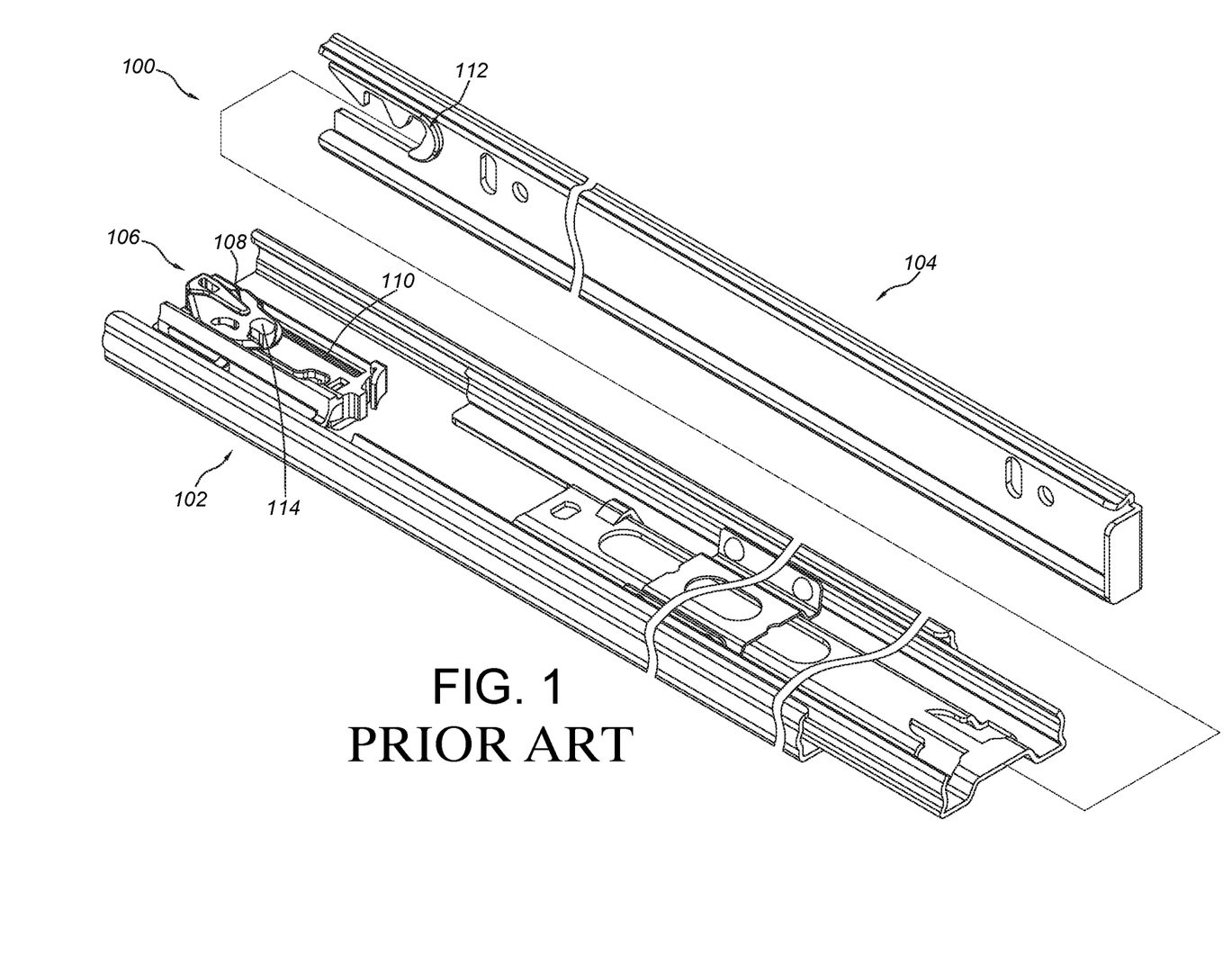
FIG. 1 is an exploded view of a slide rail assembly with a driving mechanism of the prior art.

As shown in FIG. 1, a slide rail assembly 100 comprises a first rail 102, a second rail 104 and a driving mechanism 106. Wherein, the second rail 104 is movable relative to the first rail 102 and configured to carry a carried object. The driving mechanism 106 is arranged on the first rail 102 and configured to drive the second rail 104 to be automatically retracted.

Figure 2:
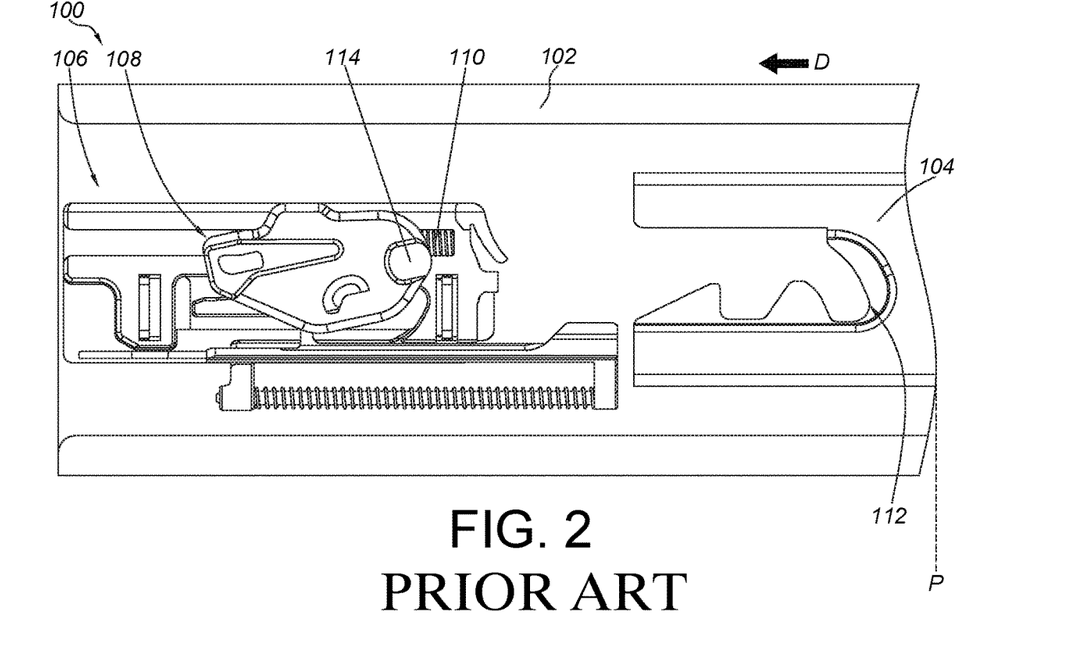
FIG. 2 is a diagram showing a second rail of the slide rail assembly of the prior art being located at an extension position relative to a first rail, wherein a driving member is in a state to hold an elastic force of an elastic member.
Figure 3:
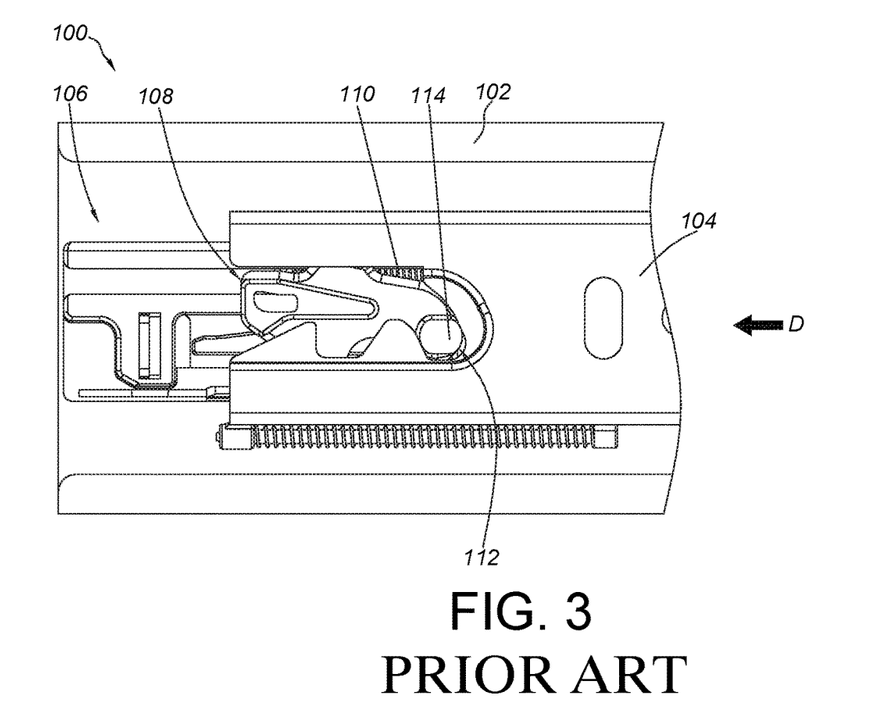
FIG. 3 is a diagram showing the second rail of the slide rail assembly of the prior art being engaged with the driving member to allow the elastic member to release the elastic force when the second rail being retracted relative to the first rail for a distance.

As shown in FIG. 2 and FIG. 3, the second rail 104 is pulled out of the first rail 102 to be located at an extension position P. Wherein, a driving member 108 of the driving mechanism 106 is in an engaged state, in order to temporarily hold an elastic force of an elastic member 110. During an end process of the second rail 104 being retracted from the extension position P along a retraction direction D, an engaging part 112 of the second rail 104 is configured to engage with an actuating part 114 of the driving member 108 in order to deflect the driving member 108 to be no longer in the engaged state. As such, the elastic force of the elastic member 110 can be released and applied to the driving member 108 along the retraction direction D, such that the driving member 108 can drive the second rail 104 to move to a retracted position along the retraction direction D, so as to achieve a so-called automatic retraction function of a slide rail.

Figure 4:
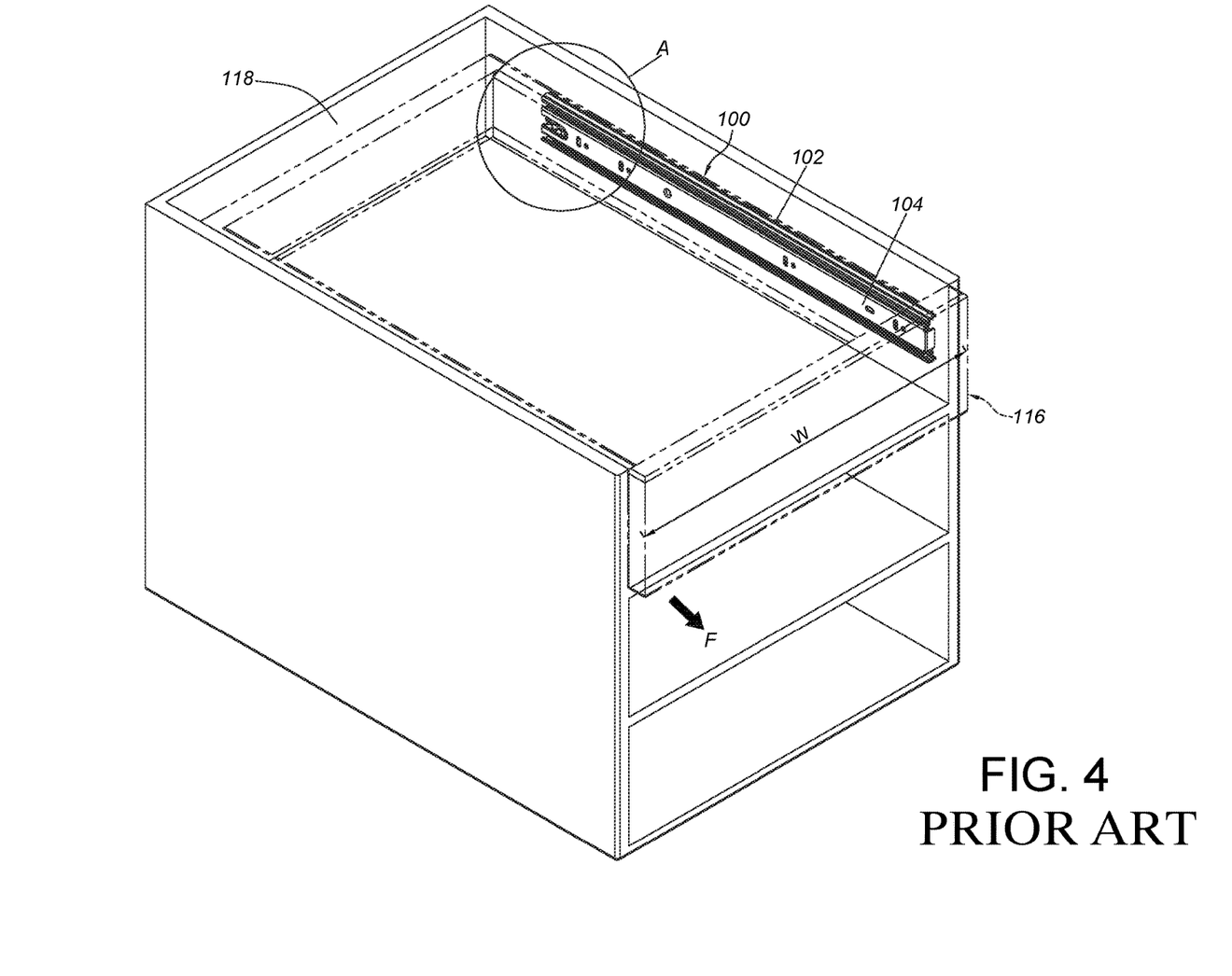
FIG. 4 is a diagram showing a carried object of the prior art being mounted to a cabinet through the slide rail assemblies.
Figures 5, 6:
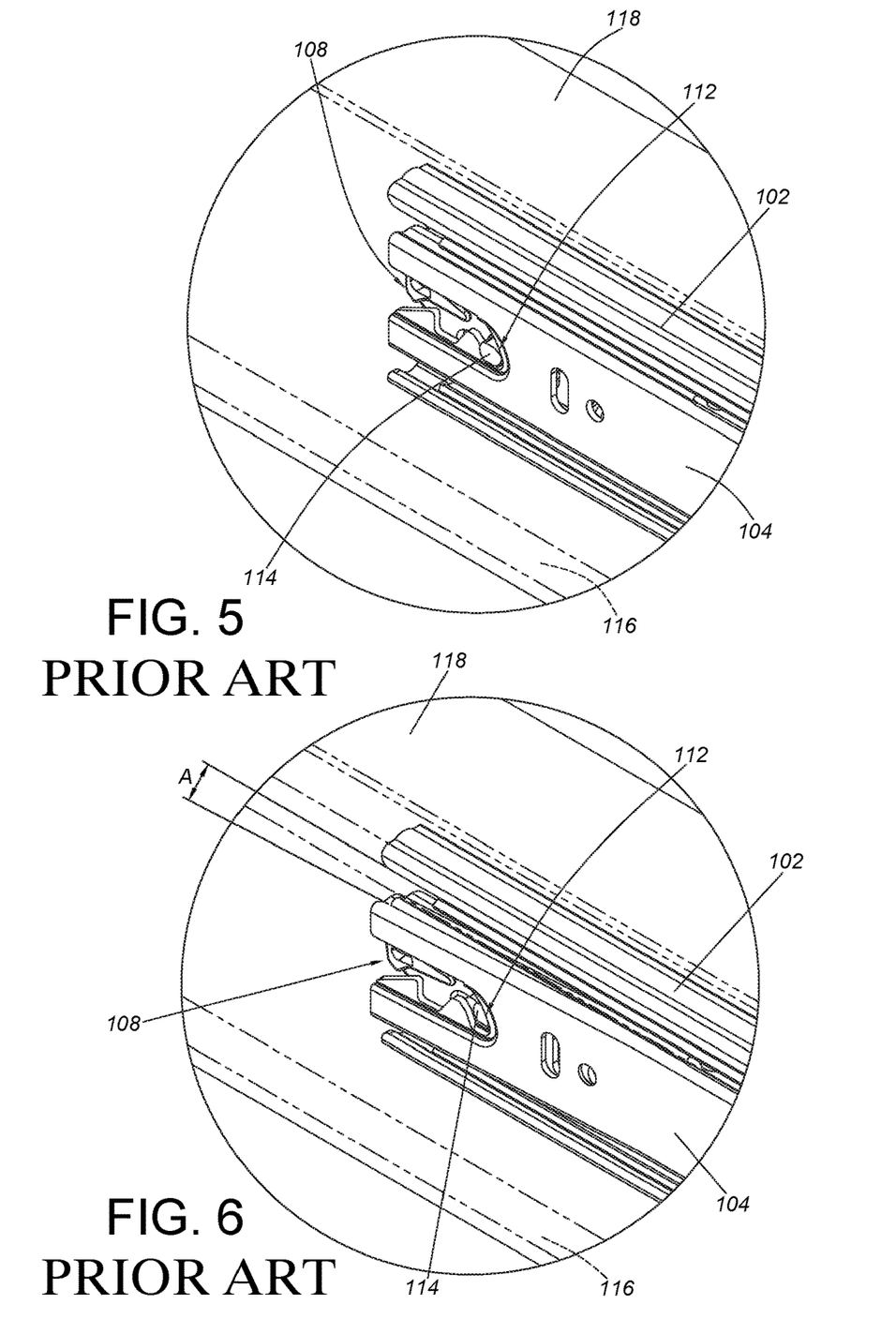
FIG. 5 is an enlarged view of an area A of FIG. 4.
FIG. 6 is a diagram, showing a portion of a slide rail of the slide rail assembly of the prior art being tilted relative to another slide rail.

As shown in FIG. 4 and FIG. 5, two sides of a carried object 116, such a drawer, can be mounted to a cabinet 118 through a pair of slide rail assemblies 100 (only one slide rail assembly is shown due to the viewing angle in figures). Wherein, the first rail 102 is mounted to the cabinet 118, and the second rail 104 is connected to the carried object 116. Furthermore, sometimes there are mounting tolerances between the carried object 116, the first rail 102, the second rail 104 and the cabinet 118; or the carried object 116 has a wider width W for some particular specification requirements. As such, when a user is going to pull the carried object 116 out of the cabinet 118 from the retracted position with a pulling force F of the user being biased to one side of the carried object 116, the second rail 104 of the slide rail assembly 100 at the other side of the carried object 116 might be tilted an angle A (as shown in FIG. 6). In such state, the engaging part 112 of the second rail 104 might be disengaged from the actuating part 114 of the driving member 108, such that the automatic retraction function is failed while the second rail 104 is retracted from the extension position P again.

SUMMARY OF THE INVENTION

The present invention relates to a slide rail assembly having a driving mechanism with improved reliability.

According to an embodiment of the present invention, a slide rail assembly comprises a first rail, a second rail and a driving mechanism. The second rail is longitudinally movable relative to the first rail. The second rail comprises an engaging feature. The driving mechanism is configured to drive the second rail to move to a retracted position during an end process of the second rail being retracted relative to the first rail from an extension position along a first direction. The driving mechanism comprises a housing, a movable member, an actuating structure and an elastic member. The housing is arranged on the first rail. The movable member is movably connected to the housing. The actuating structure is arranged on the movable member. The elastic member is configured to provide an elastic force to the movable member along the first direction. Wherein, the actuating structure comprises a first part and a second part. Wherein, the first part is configured to engage with the engaging feature of the second rail, and the second part is configured to prevent the engaging feature of the second rail from being disengaged from the first part.

Preferably, the actuating structure is transversely extended relative to the first rail and has a transverse length. The second part is configured to prevent the engaging feature of the second rail from being transversely disengaged from the first part.

Preferably, one of the first part and the second part is made of plastic, and the other one of the first part and the second part is made of metal.

Preferably, the housing comprises a longitudinal room, a longitudinal part, a bending part and a blocking wall. The longitudinal part is substantially parallel to the longitudinal room. The bending part is bent from the longitudinal part. The elastic member is arranged inside the longitudinal room. The movable member has a first side and a second side opposite to the first side. The first side is arranged with a first protrusion and a second protrusion. The actuating structure is arranged on the second side. The first protrusion abuts against the elastic member. The second protrusion is movable between the longitudinal part and the bending part. The blocking wall is configured to abut against the second protrusion when the movable member is located at a predetermined position.

Preferably, the second part is movably connected to the first part. The second part is movable relative to the first part within a limited range through a limiting feature.

Preferably, the second part is fixedly connected to the first part.

Preferably, the slide rail assembly further comprises a decelerating mechanism adjacent to the driving mechanism. The decelerating mechanism comprises a sliding base and a damper configured to provide a damping force to the sliding base. During a process of the second rail being moved to the retracted position, the movable member is configured to drive the sliding base to move, and a speed of the second rail moving toward the retracted position is reduced by the damping force.

According to another embodiment of the present invention, a slide rail assembly comprises a first rail, a second rail and a driving mechanism. The second rail is movable relative to the first rail. The second rail comprises an engaging feature. The driving mechanism comprises a housing, a movable member, an actuating structure and an elastic member. The housing is arranged on the first rail. The movable member is movable relative to the housing. The actuating structure is arranged on the movable member. The elastic member is configured to provide an elastic force to the movable member. Wherein, the actuating structure comprises a first part and a second part. Wherein, an outline of the second part is wider than an outline of the first part. Wherein, the first part is configured to engage with the engaging feature the second rail, and the second part is configured to prevent the engaging feature of the second rail from being disengaged from the first part.

According to another embodiment of the present invention, a driving mechanism comprises a housing, a movable member, an actuating structure and an elastic member. The housing comprises a longitudinal part. The movable member is movable along the longitudinal part. The actuating structure is arranged on the movable member. The actuating structure is transversely extended relative to the longitudinal part and has a transverse length. The actuating structure comprises a first part and a second part movably connected to the first part. The elastic member is configured to provide an elastic force to the movable member.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
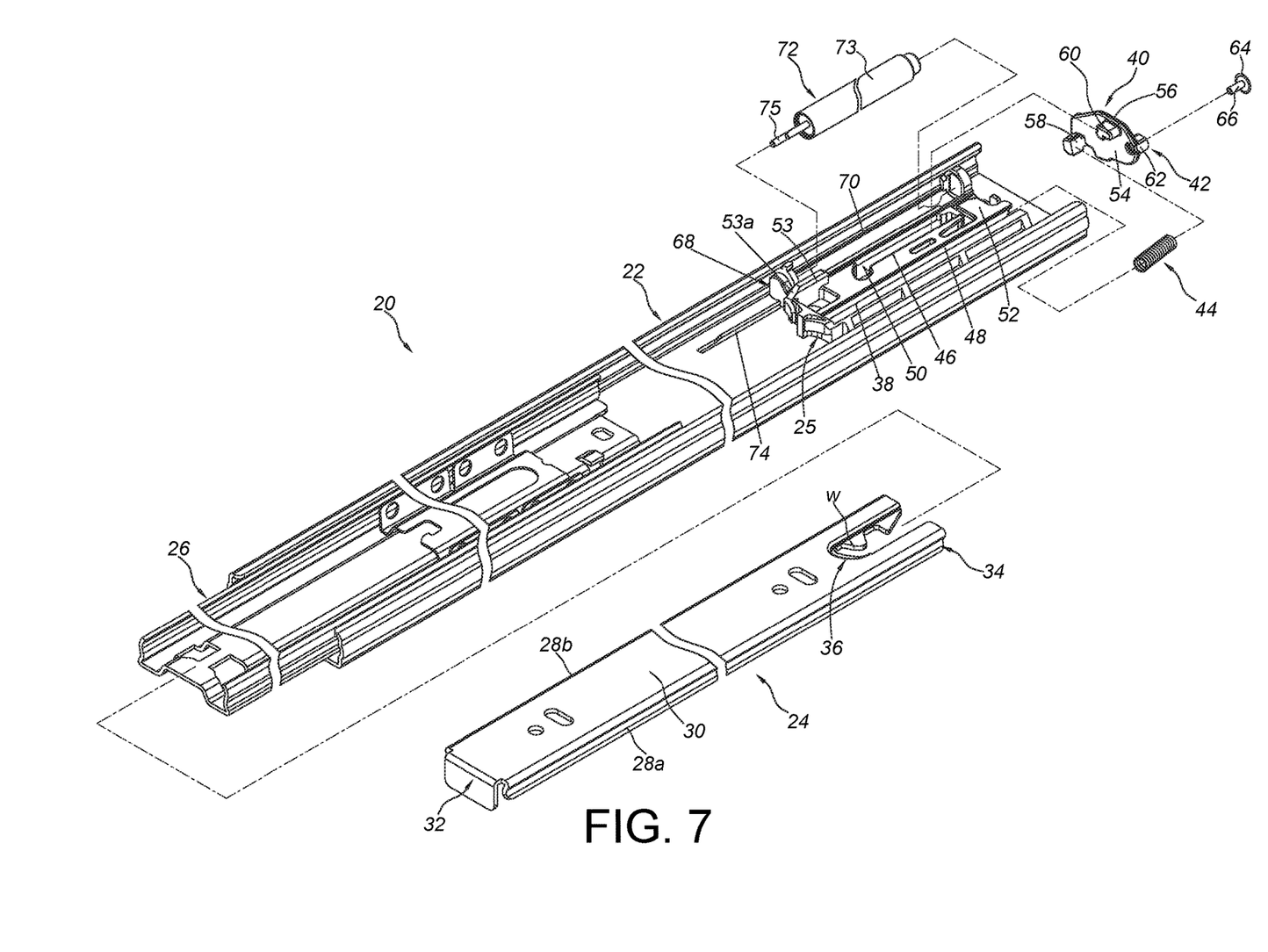
FIG. 7 is an exploded view of a slide rail assembly according to an embodiment of the present invention.
Figure 8:
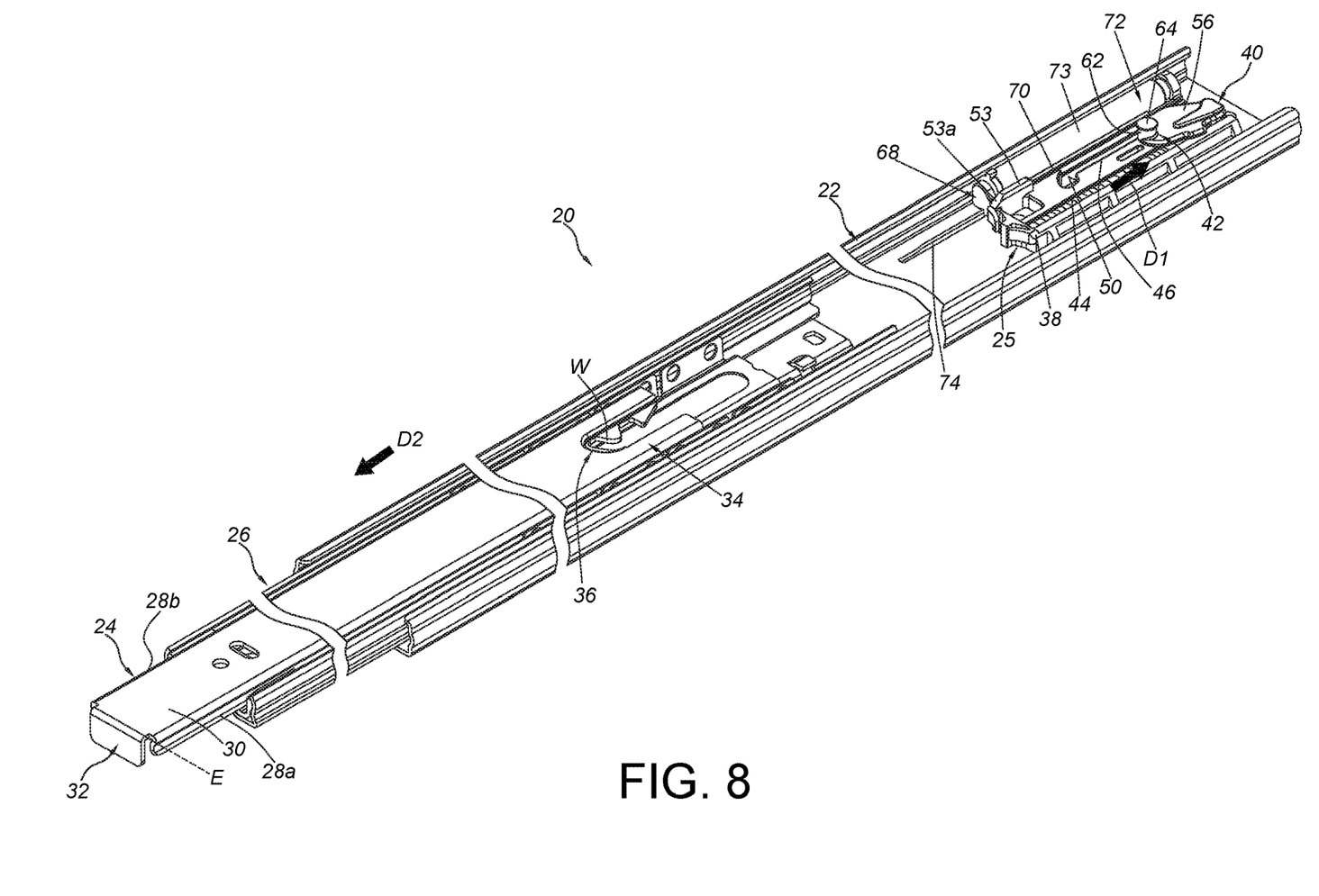
FIG. 8 is a diagram showing a second rail of the slide rail assembly being located at an extension position relative to a first rail according to an embodiment of the present invention.

As shown in FIG. 7 and FIG. 8, a slide rail assembly 20 comprises a first rail 22, a second rail 24 and a driving mechanism 25 according to an embodiment of the present invention. Preferably, the slide rail assembly 20 further comprises a third rail 26 movably mounted between the first rail 22 and the second rail 24. The third rail 26 is configured to extend a traveling distance of the second rail 24 relative to the first rail 22. Wherein, each of the first rail 22, the second rail 24 and the third rail 26 is longitudinally arranged.

The second rail 24 comprises a first wall 28a, a second wall 28b and a longitudinal wall 30 connected between the first wall 28a and the second wall 28b. The second rail 24 has a front part 32 and a rear part 34. Furthermore, the second rail 24 comprises an engaging feature 36. Preferably, the engaging feature 36 is adjacent to the rear part 34. The engaging feature 36 can be a groove or a notch surround by a side wall W.

The driving mechanism 25 is arranged on the first rail 22. In the present embodiment, the driving mechanism 25 is arranged on the first rail 22 and adjacent to a rear portion of the first rail 22. But the present invention is not limited thereto. The driving mechanism 25 comprises a housing 38, a movable member 40, an actuating structure 42 and an elastic member 44.

The housing 38 is connected to the first rail 22. For example, the housing 38 is fixedly connected to the first rail 22 by riveting, engaging or screwing. Specifically, the housing 38 comprises a longitudinal part 46. Preferably, the housing 38 further comprises a longitudinal room 48, a bending part 50, a blocking wall 52 and a supporting part 53. The longitudinal part 46 is substantially parallel to the longitudinal room 48. The bending part 50 is bent from the longitudinal part 46. The supporting part 53 is transversely protruded relative to the longitudinal part 46. One end of the supporting part 53 has a guiding surface 53a, such as an inclined surface or an arc surface. When the second rail 24 is retracted relative to the first rail 22 along a first direction D1, a rail section of the second rail 24 comprising the rear part 34 can be slightly lifted through guidance of the guiding surface 53a and supported by the supporting part 53, such that the second rail 24 can be located at a proper position when being retracted.

The movable member 40 is movably connected to the housing 38. Preferably, the movable member 40 has a first side 54 and a second side 56 opposite to the first side 54. The first side 54 is arranged with a first protrusion 58 and a second protrusion 60. The first protrusion 58 abuts against the elastic member 44, and the second protrusion 60 is movable between the longitudinal part 46 and the bending part 50.

The actuating structure 42 is arranged on the movable member 40, such as being arranged on the second side 56 of the movable member 40. Specifically, the actuating structure 42 comprises a first part 62 and a second part 64. Wherein, the first part 62 is connected to the second side 56 of the movable member 40, and the second part 64 is connected to the first part 62. Preferably, the second part 64 is connected to the first part 62 through an extension section 66. Preferably, one of the first part 62 and the second part 64 is made of plastic, and the other one of the first part 62 and the second part 64 is made of metal. In the present embodiment, the first part 62 is made of plastic and the second part 64 is made of metal, such that hardness of the second part 64 is greater than that of the first part 62 to allow the second part 64 to have greater structural strength. However, in an alternative embodiment, the first part 62 and the second part 64 can be made of a same material. The present invention is not limited thereto.

The elastic member 44 is configured to provide an elastic force to the movable member 40. Wherein, the elastic member 44 is arranged inside the longitudinal room 48. In the present embodiment, the elastic member 44 is configured to provide the elastic force to the movable member 40 along the first direction D1.

Preferably, the slide rail assembly further comprises a decelerating mechanism 68 adjacent to the driving mechanism 25. The decelerating mechanism 68 comprises a sliding base 70 and a damper 72 configured to provide a damping force to the sliding base 70. Preferably, a longitudinal feature 74, such as a groove or a hole, can be used to assist in movement of the sliding base 70 relative to the damper 72. The damper 72 can be arranged adjacent to one side of the housing 38, and the damper 72 is substantially parallel to the longitudinal part 46 of the housing 38. The damper 72 comprises a damping cylinder 73 and a rod 75 connected to the damping cylinder 73.

As shown in FIG. 8, the second rail 24 can be longitudinally moved relative to the first rail 22 to an extension position E along a second direction D2 (opposite to the first direction D1).

Figures 9, 10:
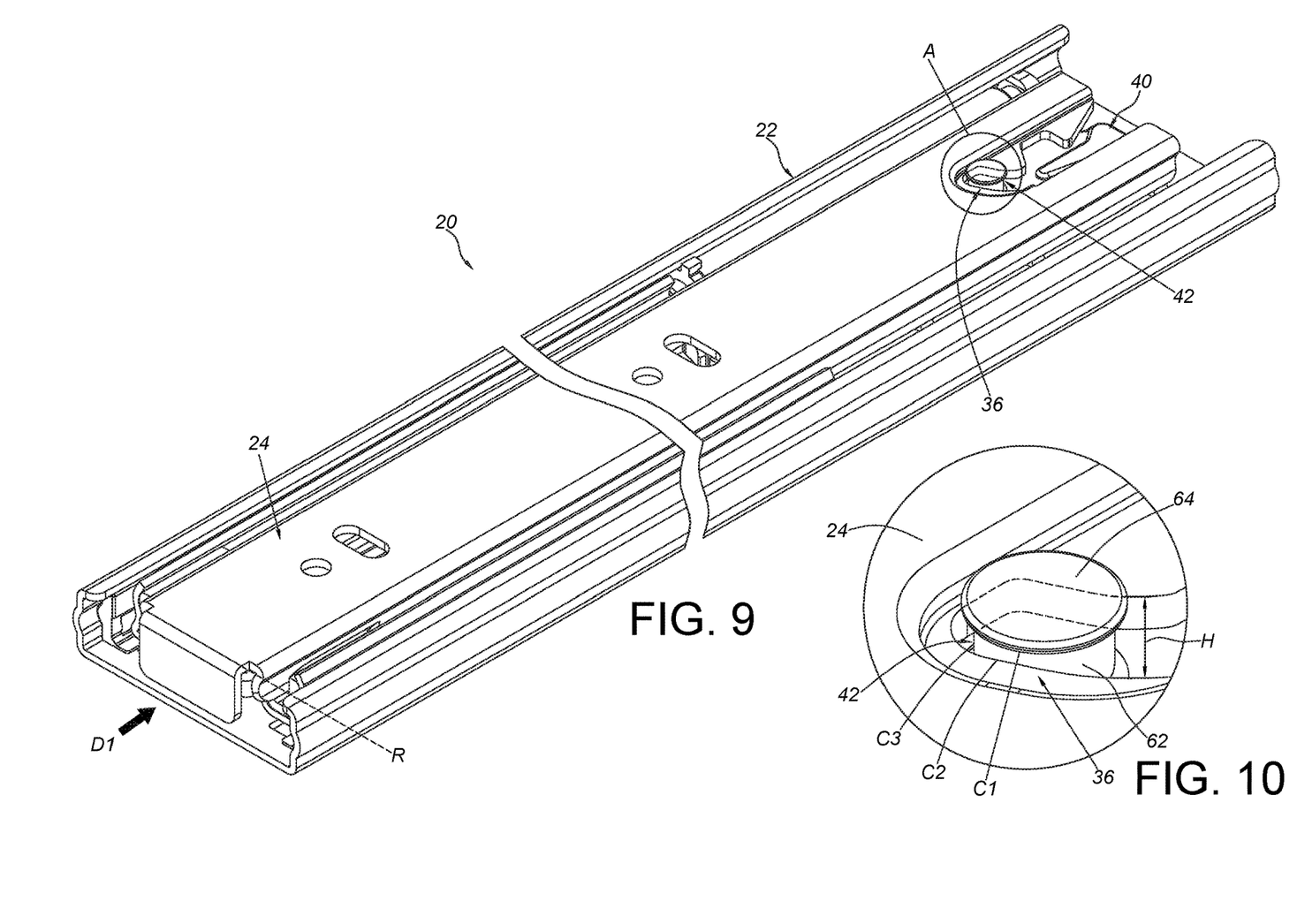
FIG. 9 is a diagram showing the second rail of the slide rail assembly being located at a retracted position relative to the first rail according to an embodiment of the present invention.
FIG. 10 is an enlarged view of an area A of FIG. 9.

As shown in FIG. 9, the second rail 24 is retracted relative to the first rail 22 from the extension position F along the first direction D1. Wherein, during an end process of the second rail 24 being retracted, the second rail 24 is engaged with the actuating structure 42 on the movable member 40 through the enraging feature 36, such that the movable member 40 can drive the second rail 24 to move to a retracted position R.

As shown in FIG. 10, when the second rail 24 is located at the retracted position R, the first part 62 of the actuating structure 42 is configured to engage with the engaging feature 36 of the second rail 24, and the second part 64 is configured prevent the engaging feature 36 of the second rail 24 from being disengaged from the first part 62. The second part 64 can improve engagement reliability between the driving mechanism 25 and the second rail 24. Preferably, the actuating structure 42 has a transverse length H relative to a longitudinal direction of the first rail 22. For example, the actuating structure 42 is transversely extended relative to the first rail 22 and has the transverse Length H.

Figures 11, 12:
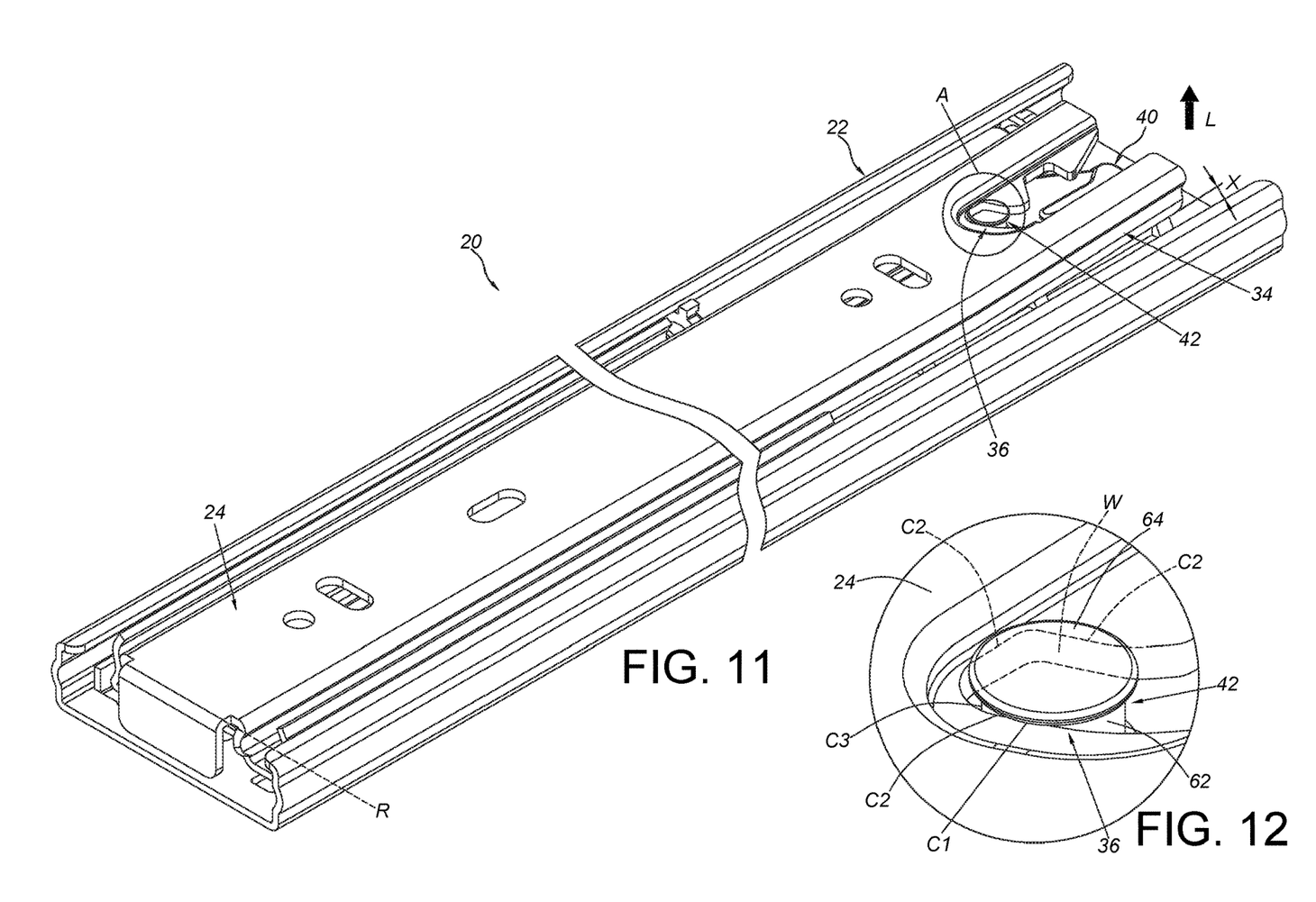
FIG. 11 is a diagram showing the second rail of the slide rail assembly being tilted relative to the first rail, and a second part of an actuating structure being configured to prevent the second rail from being disengaged from a first part according to an embodiment of the present invention.
FIG. 12 is an enlarged view of an area A of FIG. 11.

As shown in FIG. 11 and FIG. 12, sometimes the second rail 24 may be slightly tilted an angle X relative to the first rail 22 at the retracted position R due to a mounting tolerance between the slide rail assembly 20 and an object (such as a cabinet or a drawer), or a force applied from a user to an improper position on the object (such as the drawer). In the present embodiment, the rear part 34 of the second rail 24 is assumed to be tilted the angle X. In such state, the second part 64 of the actuating structure 42 is configured to prevent the engaging feature 36 of the second rail 24 from being disengaged from the first part 62 laterally or along a transverse direction L. Preferably, an outline C1 of the second part 64 exceeds at least a portion of an outline C2 of the engaging feature 36, and the outline C1 of the second part 64 is wider than an outline C3 of the first part 62. In the present embodiment, the outlines C1, C3 are in circular shapes, but the present invention is not limited thereto.

Figure 13:
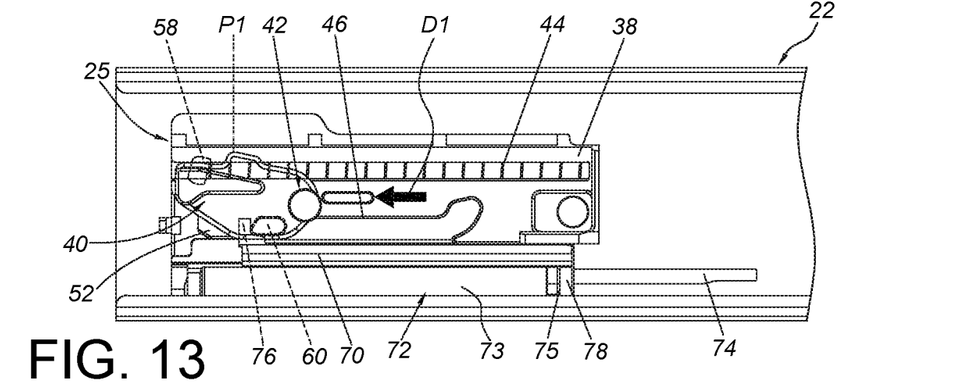
FIG. 13 is a diagram showing a driving mechanism of the slide rail assembly in a first state according to an embodiment of the present invention.

As shown in FIG. 13, the elastic member 44 is configured to provide an elastic force to the movable member 40 along the first direction D1 through the first protrusion 58, such that the movable member 40 can be located at a first predetermined position P1 in response to the elastic force. Preferably, the blocking wall 52 of the housing 38 is configured to abut against the second protrusion 60 of the movable member 40. In the present embodiment, the second protrusion 60 abuts against the blocking wall 52 through a first contact part 76 at a rear end of the sliding base 70. On the other hand, the rod 75 of the damper 72 is pressed by a second contact part 78 at a front end of the sliding base 70, such that the rod 75 can be retracted relative to the damping cylinder 73.

Figure 14:
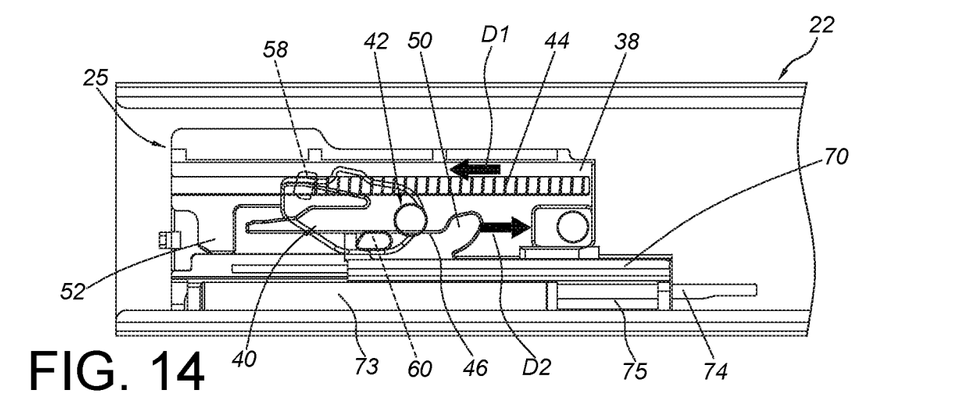
FIG. 14 is a diagram showing the driving mechanism of the slide rail assembly in a second state according to an embodiment of the present invention.

As shown in FIG. 14, when the user applies a force to the movable member 40 along the second direction D2 and the force is greater than the elastic force of the elastic member 44 along the first direction D1, the movable member 40 is moved along the second direction D2. For example, when the second rail 24 is located at the retracted position R, the engaging feature 36 is engaged with the actuating structure 42 in order to drive the movable member 40 to move along the second direction D2. Wherein, the second protrusion 60 of the movable member 40 is moved along the longitudinal part 46. On the other hand, the rod 75 is gradually extended relative to the damping cylinder 73 to drive the sliding base 70 to move alongside the longitudinal feature 74 along the second direction D2. Wherein, operations of the rod 75 and the damping cylinder 73 are well known to those skilled in the art. For simplification, no further illustration is provided.

Figure 15:
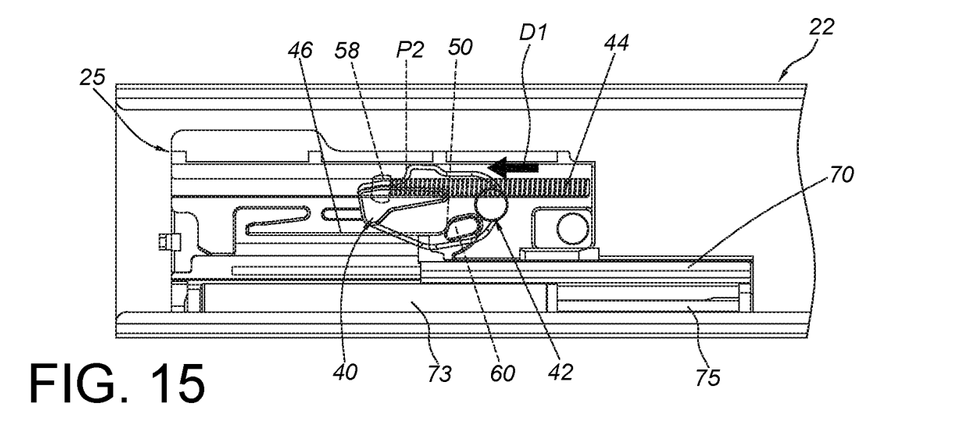
FIG. 15 is a diagram showing the driving mechanism of the slide rail assembly in a third state according to an embodiment of the present invention.

As shown in FIG. 15, when the movable member 40 is further driven by the second rail 24 to move along the second direction D2 to a second predetermined position P2, the second protrusion 60 of the movable member 40 reaches the bending part 50 from the longitudinal part 46, such that the movable member 40 is deflected to be temporarily held at the second predetermined position P2. In other words, the force of the elastic member 44 along the first direction D1 is temporarily accumulated. On the other hand, the rod 75 is completely extended relative to the damping cylinder 73. Wherein, the engaging feature 36 of the second rail 24 is disengaged from the actuating structure 42.

Moreover, during an end process of the second rail 24 being retracted from the extension position E along the first direction D1, the second rail 24 can be engaged with the actuating structure 42 through the engaging feature 36, such that the second protrusion 60 of the movable member 40 is moved back to the longitudinal part 46 from the bending part 50, and moved alongside the longitudinal part 46 until the second rail 24 is driven by the movable member 40 to move to the retracted position R along the first direction D1. Wherein, during a process of the second rail 24 being moved by the movable member 40 of the driving mechanism 25 to the retracted position R along the first direction D1, the movable member 40 can drive the sliding base 70 to move along the first direction D1. In addition, the rod 75 of the damper 72 is retracted relative to the damping cylinder 73 again to provide a damping force to reduce a speed of the movable member 40 (or the second rail 24) moving toward the retracted position R, so as to achieve a damping effect (please sequentially refer to FIG. 15, FIG. 14 and FIG. 13 for such operations).

Figure 16:
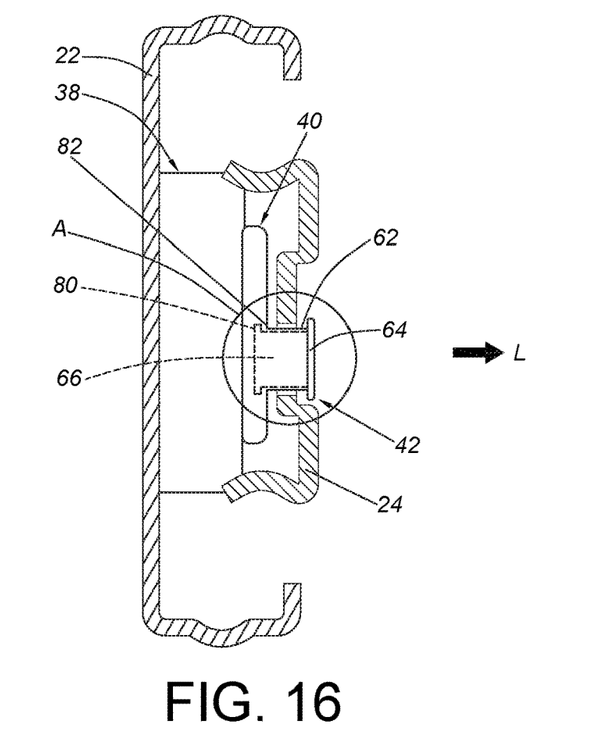
FIG. 16 is a diagram showing the second rail of the slide rail assembly being engaged with the actuating structure, and the second part of the actuating structure being located at a first position relative to the first part according to an embodiment of the preset invention.
Figure 17:
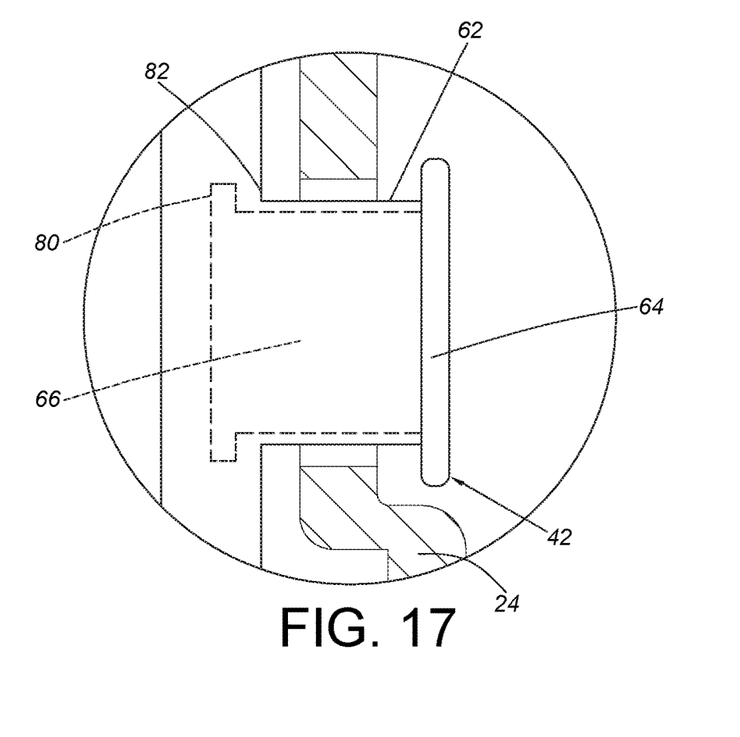
FIG. 17 is an enlarged view of an area A of FIG. 16.

As shown in FIG. 16 and FIG. 17, the second part 64 of the actuating structure 42 is movably connected to the first part 62 through the extension section 66. Preferably, the extension section 66 is extended into a space inside the first part 62, and the extension section 66 has a limiting feature 60, such as a protrusion or a flange, corresponding to an inner wall 82 of the first part 62.

Figure 18:
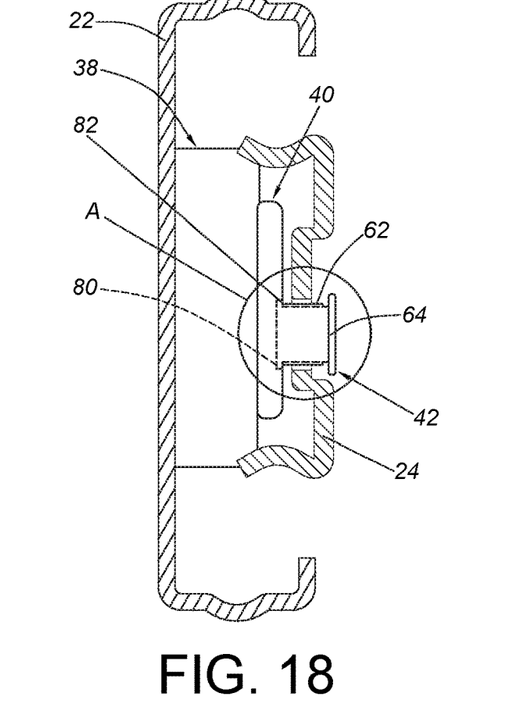
FIG. 18 is a diagram showing the second rail of the slide rail assembly being engaged with the actuating structure, and the second part of the actuating structure being located at a second position relative to the first part according to an Embodiment of the present invention.
Figure 19:
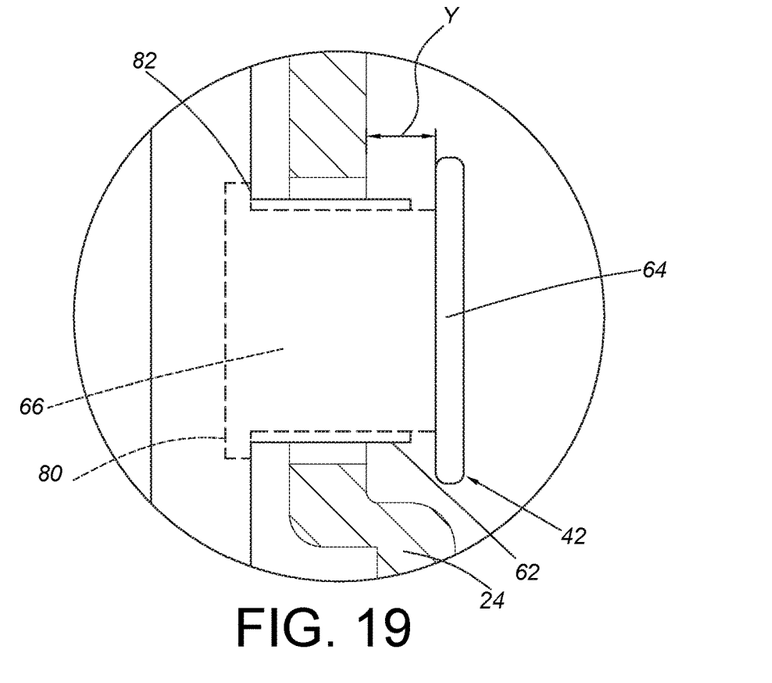
FIG. 19 is an enlarged view of an area A of FIG. 18.

As shown in FIG. 16, FIG. 18 and FIG. 19, the second part 64 of the actuating structure 42 is movable relative to the first part 62 along the transverse direction L. The limiting feature 80 is configured to abut against the inner wall 82 of the first part 62 to limit a moving range of the second part 64. In other words, the second part 64 is movable relative to the first part 62 within a limited range through the limiting feature 80. Therefore, the second part 64 of the actuating structure 42 is movable relative to the first part 62 for a tolerance Y between the second rail 24 and the second part 64.

Figure 20:
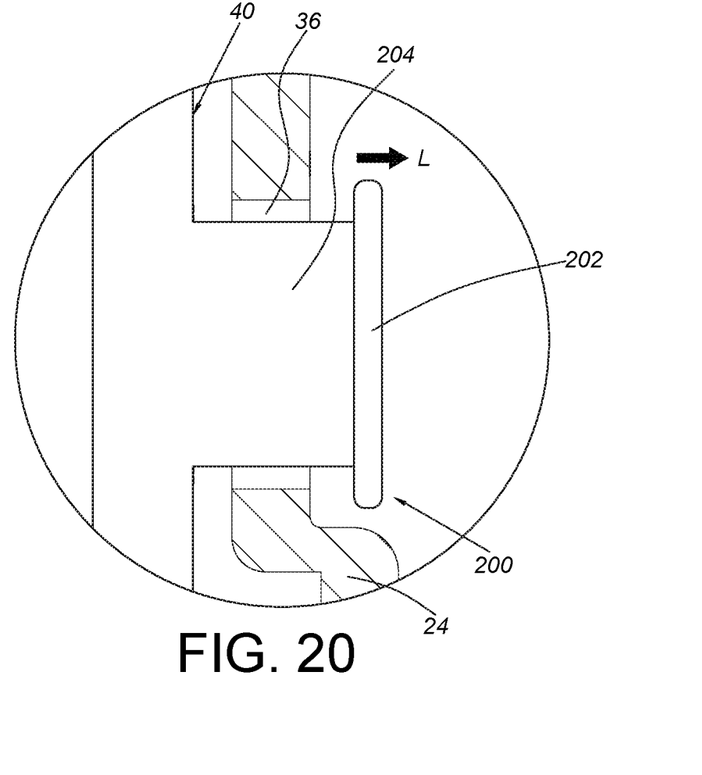
FIG. 20 is a diagram showing another embodiment of the actuating structure of the present invention.

FIG. 20 shows another embodiment of an actuating structure 200 being arranged on the movable member 40. Specifically, a second part 202 of the actuating structure 200 is fixedly connected to a first part 204 of the actuating structure 200. Wherein, an outline of the second part 202 is wider than an outline of the first part 204. In such arrangement, the first part 204 is configured to engage with the engaging feature 36 of the second rail 24, and the second part 202 is configured to prevent the engaging feature 36 of the second rail 24 from being disengaged from the first part 204. For example, when the second rail 24 is moved laterally or along the transverse direction L, the second part 202 is used for blocking the engaging feature 36 of the second rail 24 in order to prevent the engaging feature 36 of the second rail 24 from being disengaged from the first part 204.

Therefore, the slide rail assembly and the driving mechanism thereof of the present invention are characterized in that:

1. The first part 62 of the actuating structure 42 is configured to engage with the engaging feature 36 of the second rail 24, and the second part 64 is configured to prevent the engaging feature 36 of the second rail 24 from being disengaged from the first part 62, in order to improve engagement reliability between the driving mechanism 25 and the second rail 24.

2. During the process of the second rail 24 being driven by the movable member 40 of the driving mechanism 25 to move to the retracted position R, the movable member 40 can drive the sliding base 70 to move, and the rod 75 of the damper 72 is correspondingly moved relative to the damping cylinder 73 to provide a damping force.

3. When the second rail 24 is retracted relative to the first rail 22, the second rail 24 is supported by the supporting part 53 to be located at a proper position.

4. The first part 62 is made of plastic, and the second part 64 is made of metal, such that hardness of the second part 64 is greater than that of the first part 62, in order to allow the second part 64 to have greater structural strength.

5. The second part 64 of the actuating structure 42 is movable relative to the first part 62 for the tolerance Y between the second rail 24 and the second part 64.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A slide rail assembly, comprising:
a first rail;
a second rail longitudinally movable relative to the first rail, the second rail comprising an engaging feature; and
a driving mechanism configured to drive the second rail to move to a retracted position during an end process of the second rail being retracted relative to the first rail from an extension position along a first direction, the driving mechanism comprising:
a housing arranged on the first rail;
a movable member movably connected to the housing;
an actuating structure arranged on the movable member; and
an elastic member configured to provide an elastic force to the movable member along the first direction;
wherein the actuating structure comprises a first part and a second part;
wherein the first part is configured to engage with the engaging feature of the second rail, and the second part is configured to prevent the engaging feature of the second rail from being disengaged from the first part;
wherein the first part is fixedly connected to the movable member, the second part is movably connected to the first part through an extension section extended into a space inside the first part, and the extension section has a limiting feature configured to abut against an inner wall of the first part to limit a moving range of the second part relative to the first part along a transverse direction of the first rail.

2. The slide rail assembly of claim 1, wherein the actuating structure is transversely extended relative to the first rail and has a transverse length, and the second part is configured to prevent the engaging feature of the second rail from being transversely disengaged from the first part.

3. The slide rail assembly of claim 1, wherein one of the first part and the second part is made of plastic, and the other one of the first part and the second part is made of metal.

4. The slide rail assembly of claim 1, wherein the housing comprises a longitudinal room, a longitudinal part, a bending part and a blocking wall, the longitudinal part is substantially parallel to the longitudinal room, the bending part is bent from the longitudinal part, the elastic member is arranged inside the longitudinal room, the movable member has a first side and a second side opposite to the first side, the first side is arranged with a first protrusion and a second protrusion, the actuating structure is arranged on the second side, the first protrusion abuts against the elastic member, the second protrusion is movable between the longitudinal part and the bending part, the blocking wall is configured to abut against the second protrusion when the movable member is located at a predetermined position.

5. The slide rail assembly of claim 1, further comprising a decelerating mechanism adjacent to the driving mechanism, wherein the decelerating mechanism comprises a sliding base and a damper configured to provide a damping force to the sliding base, during a process of the second rail being moved to the retracted position, the movable member is configured to drive the sliding base to move, and a speed of the second rail moving toward the retracted position is reduced by the damping force.

6. The slide rail assembly of claim 1, wherein the housing comprises a longitudinal part and a supporting part transversely protruded relative to the longitudinal part, the movable member is movable along the longitudinal part, one end of the supporting part has a guiding surface; wherein when the second rail is retracted relative to the first rail along the first direction, a rail section of the second rail is configured to be lifted through guidance of the guiding surface and supported by the supporting part.

7. A slide rail assembly, comprising:
a first rail;
a second rail movable relative to the first rail, the second rail comprising an engaging feature; and
a driving mechanism comprising:
a housing arranged on the first rail;
a movable member movable relative to the housing;
an actuating structure arranged on the movable member; and
an elastic member configured to provide an elastic force to the movable member;
wherein the actuating structure comprises a first part and a second part;
wherein an outline of the second part is wider than an outline of the first part;
wherein the first part is configured to engage with the engaging feature of the second rail, and the second part is configured to prevent the engaging feature of the second rail from being disengaged from the first part;
wherein the first part is fixedly connected to the movable member, the second part is movably connected to the first part through an extension section extended into a space inside the first part, and the extension section has a limiting feature configured to abut against an inner wall of the first part to limit a moving range of the second part relative to the first part along a transverse direction of the first rail.

8. The slide rail assembly of claim 7, wherein the actuating structure has a transverse length relative to a longitudinal direction of the first rail, and the second part is configured to prevent the engaging feature of the second rail from being disengaged from the first part along the transverse direction of the first rail.

9. The slide rail assembly of claim 7, wherein one of the first part and the second part is made of plastic, and the other one of the first part and the second part is made of metal.

10. The slide rail assembly of claim 7, wherein the housing comprises a longitudinal room, a longitudinal part, a bending part and a blocking wall, the longitudinal part is substantially parallel to the longitudinal room, the bending part is bent from the longitudinal part, the elastic member is arranged inside the longitudinal room, the movable member has a first side and a second side opposite to the first side, the first side is arranged with a first protrusion and a second protrusion, the actuating structure is arranged on the second side, the first protrusion abuts against the elastic member, the second protrusion is movable between the longitudinal part and the bending part, the blocking wall is configured to abut against the second protrusion when the movable member is located at a predetermined position.

11. The slide rail assembly of claim 7, further comprising a decelerating mechanism adjacent to the driving mechanism, wherein the decelerating mechanism comprises a sliding base and a damper configured to provide a damping force to the sliding base, during a process of the second rail being moved to the retracted position, the movable member is configured to drive the sliding base to move, and a speed of the second rail moving toward the retracted position is reduced by the damping force.

12. The slide rail assembly of claim 11, wherein the damper comprises a damping cylinder and a rod connected to the damping cylinder.

13. The slide rail assembly of claim 11, wherein the housing further comprises a supporting part transversely protruded relative to the longitudinal part, one end of the supporting part has a guiding surface; wherein when the second rail is retracted relative to the first rail, a rail section of the second rail is configured to be lifted through guidance of the guiding surface and supported by the supporting part.

14. The slide rail assembly of claim 7, wherein the housing comprises a longitudinal part and a supporting part transversely protruded relative to the longitudinal part, the movable member is movable along the longitudinal part, one end of the supporting part has a guiding surface; wherein when the second rail is retracted relative to the first rail, a rail section of the second rail is configured to be lifted through guidance of the guiding surface and supported by the supporting part.

15. A driving mechanism, comprising:
a housing comprising a longitudinal part;
a movable member movable along the longitudinal part;
an actuating structure arranged on the movable member, the actuating structure transversely extended relative to the longitudinal part and having a transverse length, the actuating structure comprising a first part and a second part; and
an elastic member configured to provide an elastic force to the movable member;
wherein the first part is fixedly connected to the movable member, the second part is movably connected to the first part through an extension section extended into a space inside the first part, and the extension section has a limiting feature configured to abut against an inner wall of the first part to limit a moving range of the second part relative to the first part along a transverse direction of the first rail.

16. The driving mechanism of claim 15, wherein one of the first part and the second part is made of plastic, and the other one of the first part and the second part is made of metal.

17. The driving mechanism of claim 15, wherein the housing comprises a longitudinal room, a bending part and a blocking wall, the longitudinal part is substantially parallel to the longitudinal room, the bending part is bent from the longitudinal part, and the elastic member is arranged inside the longitudinal room.

18. The driving mechanism of claim 17, wherein the movable member has a first side and a second side opposite to the first side, the first side is arranged with a first protrusion and a second protrusion, the actuating structure is arranged on the second side, the first protrusion abuts against the elastic member, the second protrusion is movable between the longitudinal part and the bending part, the blocking wall is configured to abut against the second protrusion when the movable member is located at a predetermined position.

* * * * *